United States Patent [19]

Nakano et al.

[11] Patent Number: 4,806,845
[45] Date of Patent: Feb. 21, 1989

[54] SYSTEM FOR MEASURING AND GENERATING ELECTRIC NOISE

[75] Inventors: Jiro Nakano, Okazaki; Takashi Ogawa, Toyota, both of Japan

[73] Assignee: Toyota Jidosha Kabushiki Kaisha, Aichi, Japan

[21] Appl. No.: 859,991

[22] Filed: May 5, 1986

[30] Foreign Application Priority Data

May 7, 1985 [JP] Japan .............................. 60-96267
Jul. 18, 1985 [JP] Japan ............................. 60-158629

[51] Int. Cl.$^4$ ........................................... G01R 27/00
[52] U.S. Cl. ................................ 324/57 N; 324/77 A
[58] Field of Search ............... 324/57 N, 77 A, 57 R; 329/130; 381/71, 194; 328/162

[56] References Cited

U.S. PATENT DOCUMENTS 4,553,086 11/1985 Watanabe et al. ............... 324/57 N Primary Examiner—A. D. Pellinen
Assistant Examiner—Leon K. Fuller
Attorney, Agent, or Firm—Parkhurst, Oliff & Berridge

[57] ABSTRACT

In measuring and reproducing electric noise applied to an electronic component, the electric noise is envelope-detected and the envelope-detected noise is analog-digitally converted at high speed and stored. With this arrangement, electric noise, complicated and low in reproducibility, is accurately measured and stored. Further, a result obtained by performing a predetermined calculation on the stored value is digital-analog converted at high speed, reproducing the envelope-detected waveform as an analog signal, and a carrier signal having a center frequency of the electric noise is amplitude-modulated by the analog signal. As a consequence, imitation noise determined quantitatively can be accurately and repeatedly generated. Furthermore, when a repeated frequency of the electric noise is counted and stored, the basic frequency components of the electric noise can be measured without use of additional measuring instruments.

6 Claims, 10 Drawing Sheets

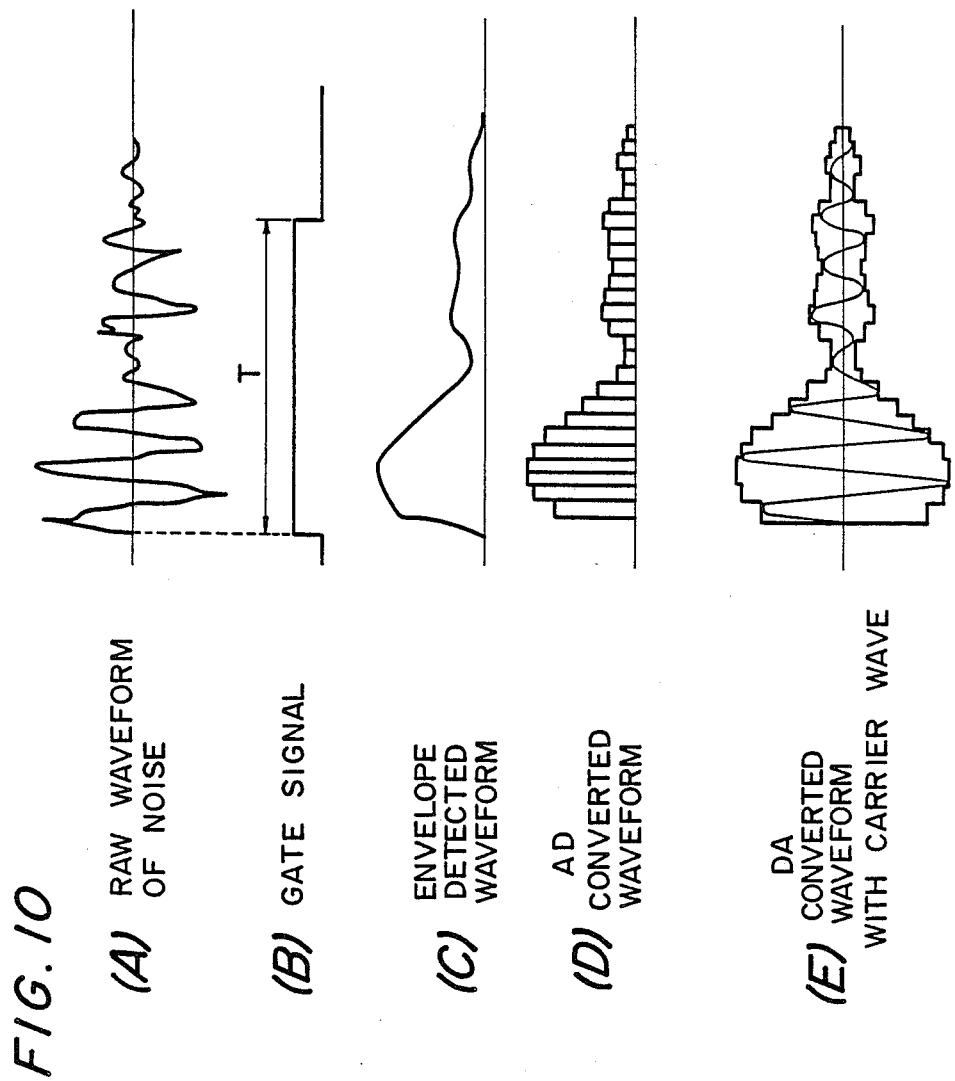

SYSTEM FOR MEASURING AND GENERATING ELECTRIC NOISE

BACKGROUND OF THE INVENTION (a) Field of the Invention

This invention relates to a system for measuring and generating electric noise, and more particularly to an electric noise measuring and generating system for measuring electric noise applied to an electric component and reproducing the same, which is suitable for measuring electric noise emitted from various noise generating sources under real use environmental conditions, e.g. in the state of being mounted on a vehicle and applied to the electronic component for analyzing the anti-noise performance of the electronic component.

(b) Description of the Prior Art

In general, electric noise applied to an electronic component has heretofore been measured by use of an oscilloscope. Furthermore, to grasp the anti-noise performance of the electronic component, there has been known a method, wherein a noise simulator is used to apply a test voltage of a waveform, turned into a model, to the electronic component to search for the presence of damages and malfunction of the electronic component.

However, in general, electric noise generated from various noise sources, e.g. the electric noises generated, when the inductance and capacitance are switched, have complicated and indeterminate waveforms different from a waveform turned into a model, which is generated from the noise simulator. On the other hand, the influence received by the electronic component subjected to the electric noise is varied, depending upon the frequencies, peak value, time duration of the noise and so on. Because of this, in evaluating the anti-noise performance of the electronic component, the conventional method, wherein the performance is surveyed under the conditions, which are turned into models by use of the noise simulator, or tests are actuatlly conducted on various noise generating sources, presents such disadvantages in that the reproducibility is low and difficulties are met in accurately analyzing the anti-noise performance of the electronic component.

SUMMARY OF THE INVENTION

The present invention has been developed to obviate the above-described disadvantages of the prior art and has as its firwt object the provision of an electric noise measuring and generating system capable of accurately measuring electric noise emitted from various noise generating sources under real use environmental conditions, e.g. in the state of being mounted on a vehicle and applied to an electronic component and of reproducing the same, so that the anti-noise performance of the electronic component can be accurately analyzed.

A second object of the present invnetion is to provide an electric noise measuring and generating system, wherein the above-described electric noise is accurately and readily measured and reproduced without measuring the basic frequency components separately, so that the anti-noise performance of the electronic component can be accurately and readily analyzed.

To achieve the first object, the present invention contemplates that, in an electric noise measuring and generating system for measuring electric noise applied to an electronic component and reproducing the same, the system includes:

means for envelope-detecting the electric noise;

means for analog-digitally converting an output from the envelope-detecting means at high speed and storing the same;

means for analog-digitally converting at high speed the result obtained by giving a predetermined calculation to the value thus stored and for reproducing a waveform associated with the envelope into an analog signal;

means for generating a carrier signal having a center frequency of the electric noise; and means for amplitude-modulating the carrier signal by the analogue signal and power-amplifying the same.

A specific form of the present invention is of such an arrangement that means for regulating an input level of the electric noise is provided on the input side of the envelope-detecting means.

Another specific form of the present invention is of such an arrangement that the storing means stores the envelope-waveform upon reaching of the output level of the envelope-detecting means to a preset value or more, until lapsing a preset period of time.

A further specific form of the present invention is of such an arrangement that the amplification factor or gain or mu-factor of the amplitude-modulation and power-amplification means is made variable.

To achieve the second object, the present invention contemplates that, in an electric noise measuring and generating system for measuring electric noise applied to an electronic component and reproducing the same, the system includes:

means for envelope-detecting the electric noise;

means for analog-digitally converting an output from the envelope-detecting means at high speed;

means for counting repeated frequency of the electric noise;

means for storing the analog-digitally converted envelope waveform data and the frequency data;

means for digital-analog converting at high speed the result obtained by giving a predetermined calculation to the stored envelope waveform data and for reproducing the waveform associated with the envelope into an analog signal;

means for generating a carrier signal having the stored frequency data as its repeated frequency; and means for amplitude-modulating the carrier signal by the analogue signal and outputting the same.

A specific form of the present invention is of such an arrangement that the envelope waveform reproducing means includes a function of optionally changing the envelope waveform to be reproduced.

According to the present invention, in measuring electric noise applied to the electronic component and reproducing the same, the electric noise is envelope-detected and an output thus obtained is analog-digitally converted at high speed and stored. In consequence, the electric noise, complicated and low in reproducibility, which is emitted from the various noise generating sources under environmental conditions of real use, e.g. in the state of being mounted on the vehicle and applied to the electronic component, can be accurately measured and stored. In consequence, the anti-noise performance of the electronic component can be quantitatively grasped. Furthermore, the result obtained by giving a predetermined calculation to the stored value is digital-analog converted at high speed, the waveform associated with the envelope is reproduced into the analog signal, and the carrier signal having the center frequency of the electric noises is amplitude-modulated by the analogue signal and power-amplified. In consequence, imitation noise thus quantitatively determined can be accurately and repeatedly generated, whereby the reproduced noise is applied to the electronic component to seek the limit value of the anti-noise performance of the electronic component, so that the noise margin can be analyzed from a difference between the limit value and the measured value. Further, the data are written into the storing means, so that an optional noise waveform can be generated.

Furthermore, means for regulating an input level of the electric noise is provided on the input side of the envelope-detecting means, whereby an envelope waveform suitable for a dynamic range of the analog-digital conversion can be inputted, so that the analog-digital conversion can be carried out with high accuracy.

Additionally, the storing means stores the envelope waveform upon the output level of the envelope-detecting means reaching a preset value or more, for a preset period of time, so that the waveform of the electric noise can be accurately measured and reproduced with a small storage capacity.

Furthermore, the amplification factor or gain or mu-factor of the amplitude-modulation and power-amplification means is made variable, so that an optional level of noise waveform can be reproduced.

According to the present invention, in measuring the electric noises applied to the electronic component and reproducing the same, the electric noises are envelope-detected and the output thus obtained is analog-digitally converted at high speed and stored, and moreover, repeated frequencies of the electric noises are counted and stored. In consequence, the electric noise emitted from various noise generating sources under real use environmental conditions (e.g. in the state of being mounted on a vehicle and applied to an electronic component) can be accurately measured and stored, Further, the basic frequency components of the electric noise can be measured readily with no additional use of any other measuring instrument. Furthermore, it becomes possible to set a more appropriate noise filter to the electronic component by use of measured values of the basic frequency components.

Further, the result obtained by giving the predetermined calculation to the stored envelope waveform data is analog digitally converted at high speed, the waveform associated with the envelope is reproduced into the analog signal, and the carrier signal having the stored frequency data as its repeated frequency is amplitude-modulated by the analog signal and outputted. In consequence, the imitation noise quantitatively determined can be accurately and readily generated, whereby the reproduced noise is applied to the electronic component to seek the limit value of the anti-noise performance of the electronic component, so that the noise margin can be analyzed from the difference between the limit value and the measured value.

Furthermore, when the envelope waveform reproducing means includes the function of optionally changing the envelope waveform to be reproduced, an optional noise waveform can be generated.

BRIEF DESCRIPTION OF THE DRAWINGS

The exact nature of this invention, as well as other objects and advantages thereof, will be readily apparent from consideration of the following specification relating to the accompanying drawings, in which like reference characters designated the same or similar parts throughout the figures and wherein:

FIGS. 10(A) through 10(E) are charts showing the operating waveforms in the various sections of the second embodiment.

DESCRIPTION OF THE PREFERRED EMBODIMENTS

Detailed description will hereunder be given of the embodiments of the present invention with reference to the drawings.

Figure 1:
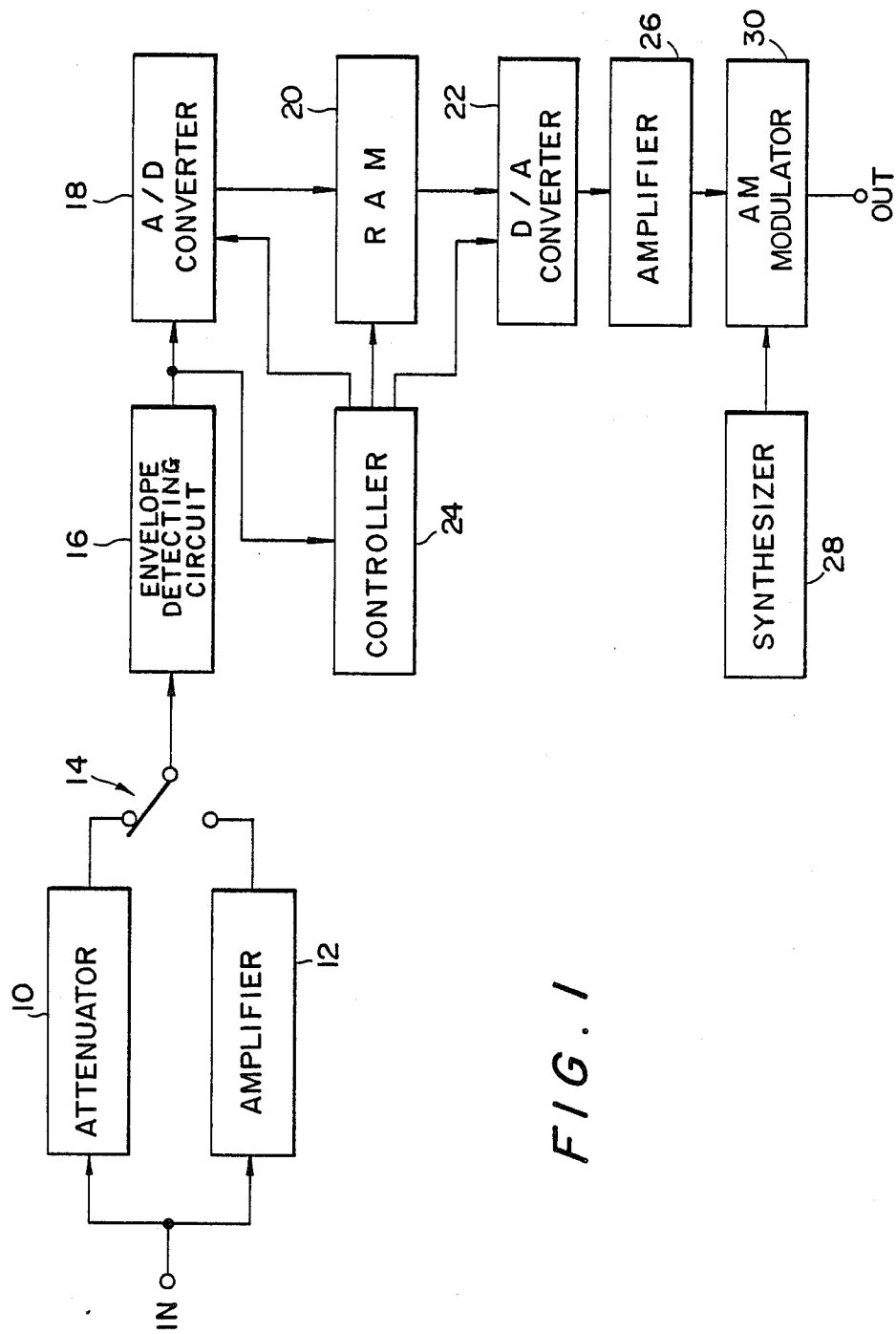
FIG. 1 is a block diagram showing the general arrangement of a first embodiment of the electric noise measuring and generating system according to the present invention.

As shown in FIG. 1, the first embodiment of the present invention includes:

an attenuator 10, an amplifier 12 and a change-over switch 14, which regulate the input level of the electric noise inputted from a noise generating source, not shown;

an envelope-detecting circuiut 16 for envelope-detecting the electric noise level-regulated in the attenuator 10 or the amplifier 12;

an analog-digital (hereinafter referred to as "A/D") converter 18 for analog-digitally (A/D) converting an output from the envelope-detecting circuit 16 at high speed;

a ramdom access memory (hereinafter referred to as a "RAM") 20 for storing an output from the A/D converter 18;

a digital-analog (hereinafter referred to as a "D/A") converter 22 for digital-analog (D/A) converting the result obtained by giving a predetermined calculation to the data stored in the RAM 20 at high speed, and reproducing the waveform associated with the envelope as an analog voltage signal;

a controller 24 for starting the A/D converter 18 when an output level of the envelope-detecting circuit 16 reaches a preset value or more, causing the RAM 20 to store the envelope waveform until a preset period of time elapses, and operating the D/A converter 22 in response to a noise waveform reproduction command inputted from the outside;

an amplification factor or gain or mu-factor variable amplifier 26 for amplifying an output from the D/A converter 22;

a synthesizer 28 for generating a carrier signal having a center frequency of the electric noise; and an amplitude (hereinafter referred to "Am") modulator 30 for AM modulating the carrier signal by the analog voltage signal and outputting the same.

Figure 2:
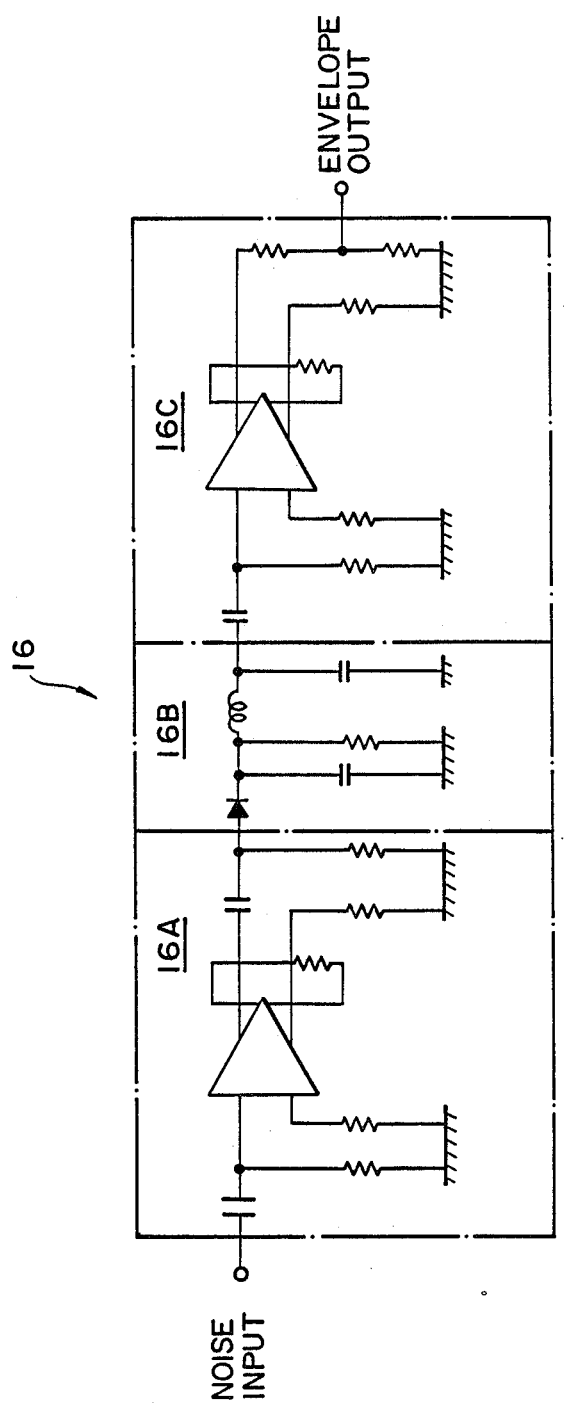
FIG. 2 is a circuit diagram showing the arrangement of the envelope-detecting circuit used in the first embodiment.
Figure 3:
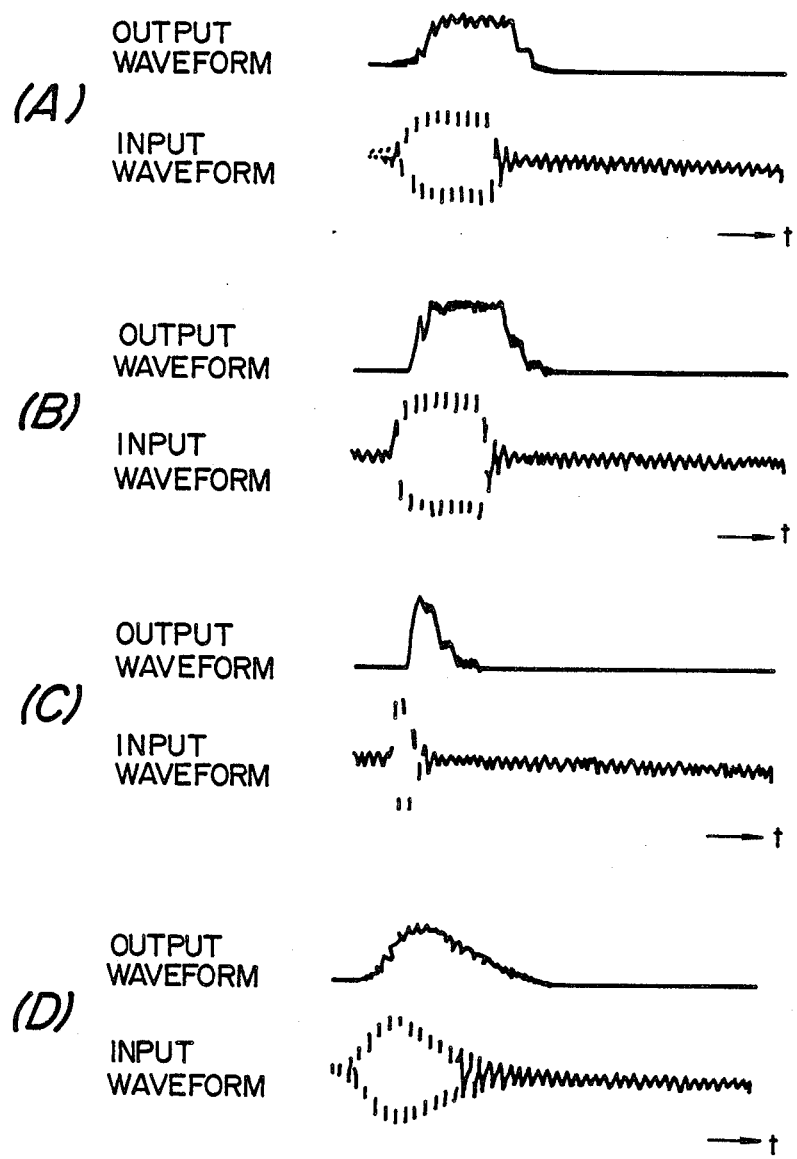
FIGS. 3(A) through 3(D) are charts showing examples of the input and the output waveforms of the envelope-detecting circuit.

As shown in FIG. 2 in detail, the envelope-detecting circuit 16 includes:

an amplifier 16A for amplifying a noise input;

a detecting circuit 16B for half-wave rectifying an output from the amplifier 16A to convert the same into an envelope waveform; and an amplifier 16C for amplifying an envelope signal from the detecting circuit 16B and inputting the same to the A/D converter 18.

In consequence, input and output waveforms from this envelope-detecting circuit 16 are as shown in FIGS. 3(A) through 3(D) for example.

Figure 4:
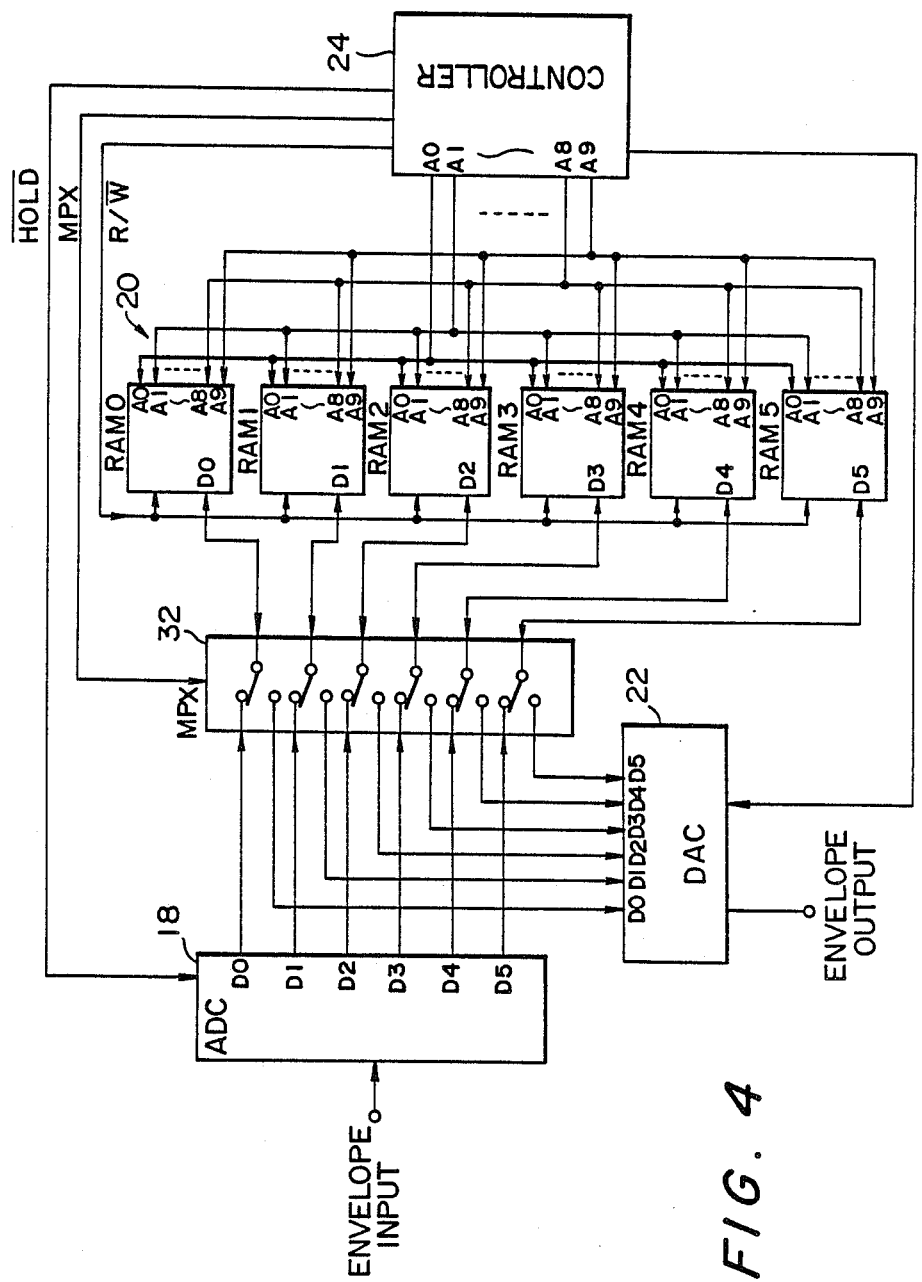
FIG. 4 is a block diagram showing the arrangement of an analog-digital converter, a random access memory, a digital-analog converter and a controller as used in the first embodiment.

Specifically, the A/D converter 18, the RAM 20, the D/A converter 22 and the controller 24 are of such arrangements as detailedly shown in FIG. 4. A common multiplexer (hereinafter referred to as an "MPX") 32 is inteposed between the output side of the A/D converter 18 and the RAM 20 and between the RAM 20 and the input side of the D/A converter 22.

Figure 5:
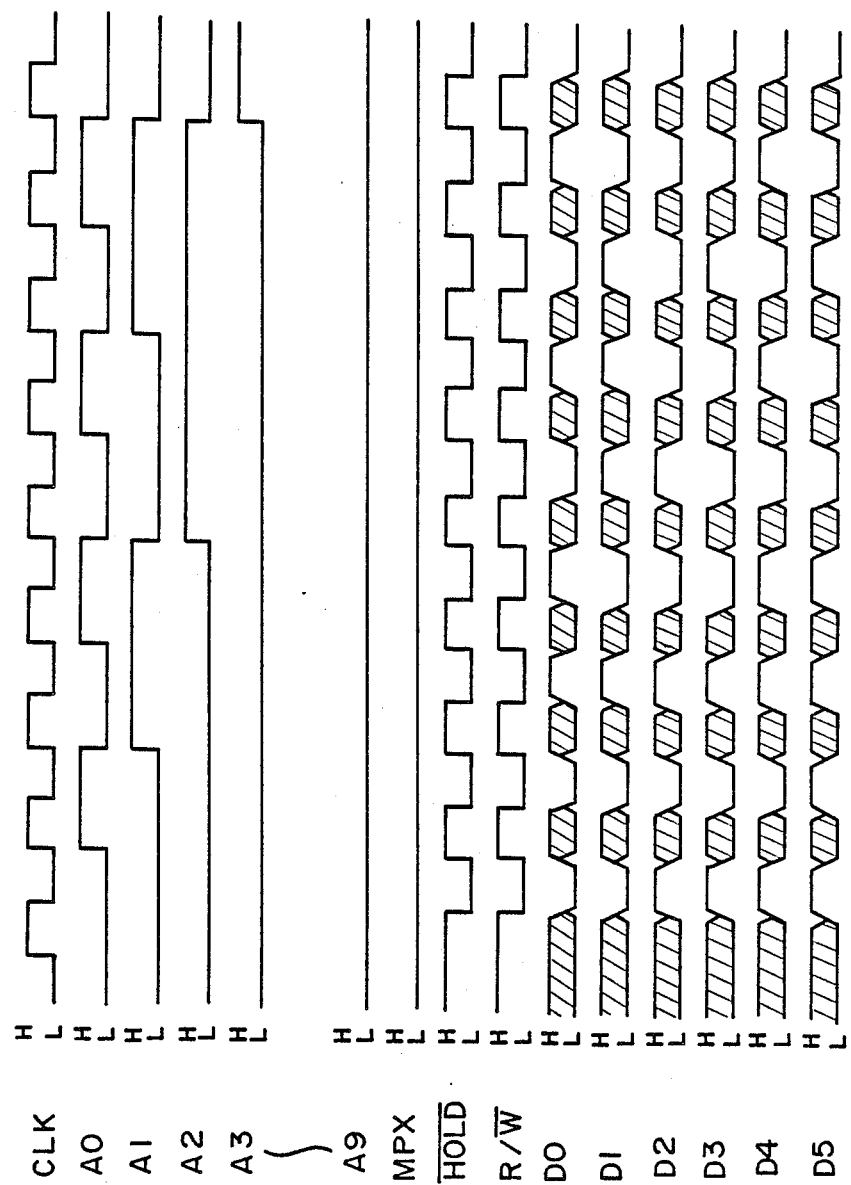
FIG. 5 is a time chart showing the conditions of the analog-digital conversion in the first embodiment.

In performing the A/D conversion with the system shown in FIG. 4, and MPX output of the controller 24 becomes low (hereinafter referred to as Lo) as shown in FIG. 5, and the MPX 32 connects the A/D converter 18 to the RAM 20 including RAM 0-RAM 5. In this state, when the envelope waveform reaches a preset level or more, the controller 24 outputs high (hereinafter referred to as Hi) to a HOLD output port and the A/D converter 18 A/D convers the envelope. Simultaneously with this, the controller 24 outputs an address signal to output ports A0-A9 and makes access to RAM 0-RAM 5. In the succeeding cycle, the controller 24 outputs a HOLD output Lo, and the A/D converter 18 stops the A/D conversion and hold outputs D 0-D 5. Simultaneously with this, the controller 24 makes a read-out/write-in output (hereinafter referred to as an "R/W output") Lo, and writes in the held data D 0-D 5 of the A/D converter 18 into RAM 0-5. Further, in the succeeding cycle, the controller 24 outputs Hi to the HOLD output port, starts the A/D converter 18 again, output the succeeding address signal to A 0-A 9, and carries out the write-in of the succeeding data into RAM 0-RAM 5. By repeating this operation, the envelope waveform is A/D converter and stored in RAM 0-RAM 5. FIG. 5 shows the case where the data (D0, D1, D2, D3, D4, D5) are (0, 0, 1, 1, 1, 1), (0, 0, 0, 0, 0, 1), (1, 1, 1, 1, 1, 1), (1, 0, 0, 0, 1, 1), (0, 1, 1, 0, 0, 0), (1, 1, 0, 0, 1, 0,) (0, 1, 0, 1, 0, 1) and (1, 0, 0, 0, 1, 0), respectively.

Figure 6:
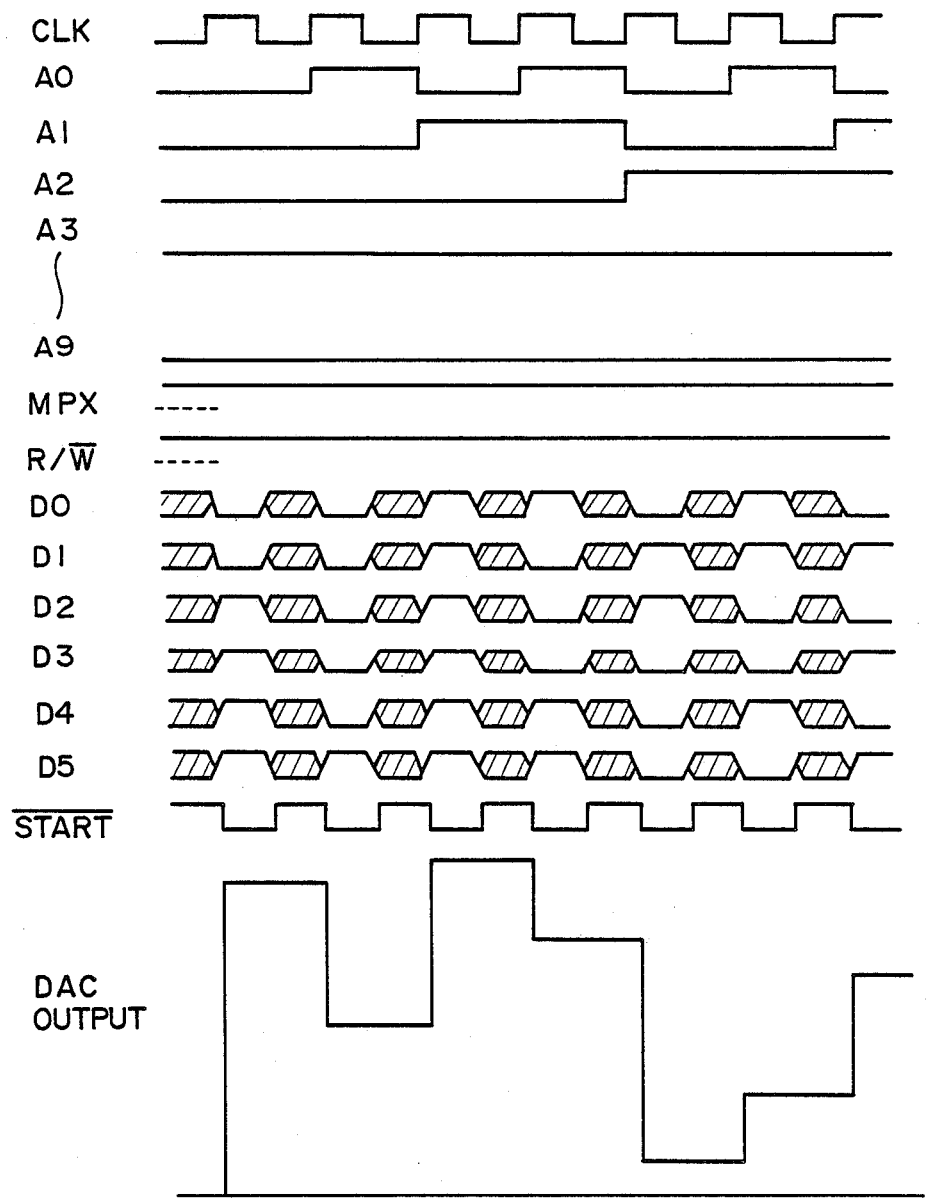
FIG. 6 is a time chart showing the conditions of the digital-analog conversion in the first embodiment.

On the other hand, in performing the D/A conversion with the system shown in FIG. 4, the MPX output of the controller 24 becomes Hi as shown in FIG. 6, and the MPX 32 connects the D/A converter 22 to RAM 0-RAm 5. In this state, when a noise waveform reproduction command is inputted from the outside, the controller 24 outputs Lo to a START output port, and simultaneously, outputs an address signal to A 0-A 9. By this, RAM 0-RAM 5 outputs data of the address, which has been given access, to D 0-D 5. This output from D 0-D 5 is D/A converted by the D/A converter 22 to reproduce an analog voltage. In the succeeding cycle, the controller 24 makes the START output Hi, and the D/A converter 22 holds the previous output. In the succeeding cycle, the controller 24 outputs the succeeding address signal to A 0-A 9, and makes the START output Lo. By repeating this operation, data within RAM 0-RAM 5 are reproduced by the D/A conversion and returned to the initial envelope waveshape. FIG. 6 shows the case where the data (D0, D1, D2, D3, D4, D5) are (0, 0, 1, 1, 1, 1), (0, 0, 0, 0, 0, 1), (1, 1, 1, 1, 1, 1), (1, 0, 0, 0, 1, 1), (0, 1, 1, 0, 0, 0), (1, 1, 0, 0, 1, 0) and (0, 1, 0, 1, 0, 1), respectively.

Figure 7:
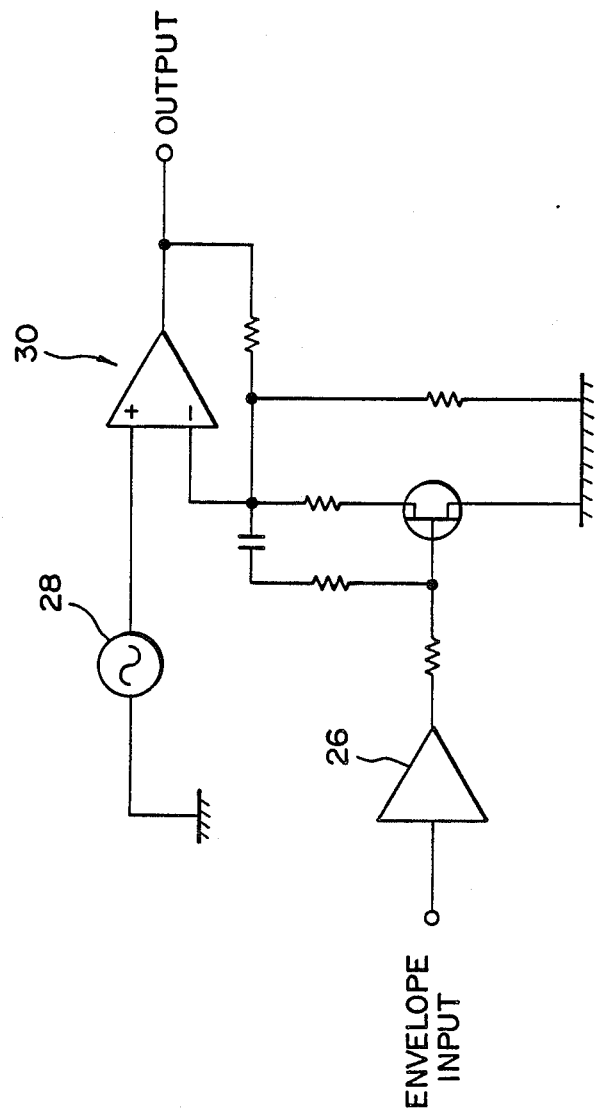
FIG. 7 is a circuit diagram showing the arrangement of an amplitude modulator used in the first embodiment.

As detailedly shown in FIG. 7, in the AM modulator 30, a carrier signal generated by the synthesizer 28 is applied thereto with the AM modulation by the envelope signal (analog voltage signal) reproduced by the D/A converter 22 and amplified by the amplifier 26, whereby the initial noise waveform is reproduced.

Description will hereunder be given of action of the first embodiment.

Figure 8:
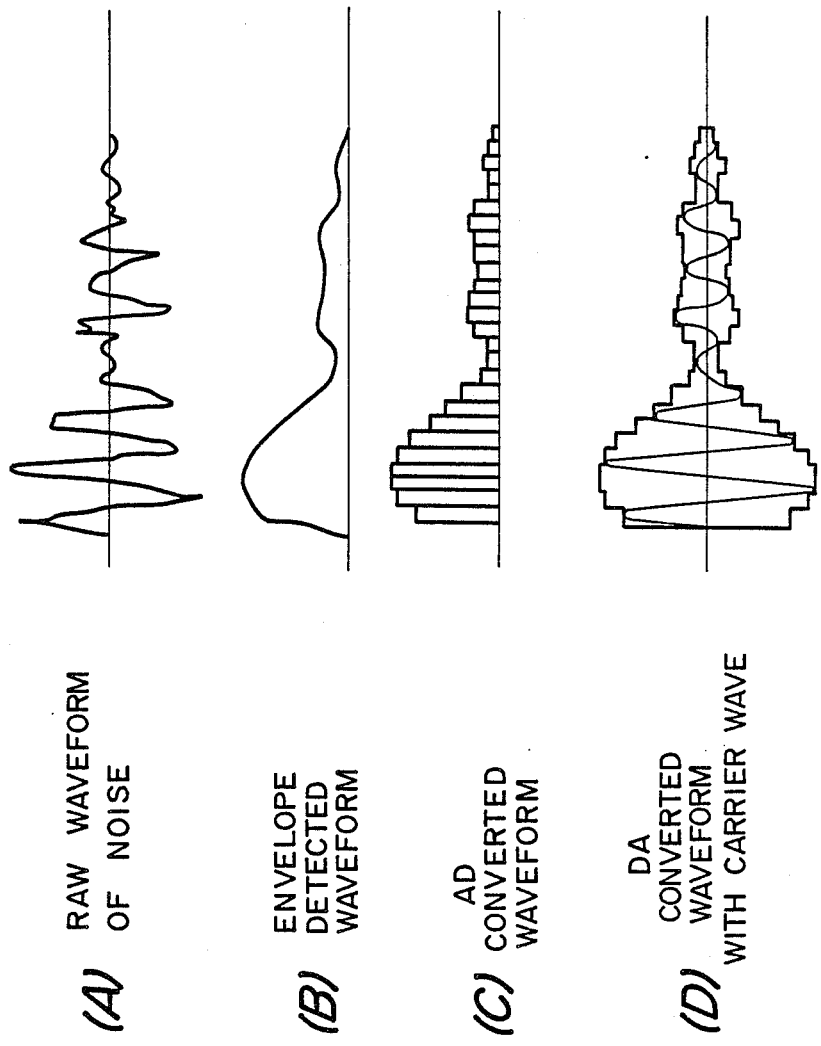
FIGS. 8(A) through 8(D) are charts showing the operating waveforms in the various sections in the first embodiment.

Now, when the raw noise waveform is as shown in FIG. 8(A), this raw waveform is attenuated or amplified by the attenuator 10 or the amplifier 12, which is suitably selected by the change-over switch 14, envelope-detected by the envelope-detecting circuit 16 and comes to be an envelope-detected waveform as shown in FIG. 8(B). When this envelope waveform reaches a preset level or more, the controller 24 starts the A/D converter 18, accesses the RAM 20, and an A/D converted waveform shown in FIG. 8(C) is stored in the RAM 20. The controller 24 repeatedly performs the above-described operation a certain number of times predetermined by the storage capacity of the RAM 20. By this, in the RAM 20, there are stored the envelope noise waveforms after the envelope reaches a certain level or more, during a preset period of time.

On the other hand, in reproducing the noise waveform, the controller 24 accesses the RAm 20 in response to a noise waveform reproduction command inputted from the outside, and starts the D/A converter 22 to reproduce the envelope waveform. The envelope waveform thus reproduced is amplified by the amplifier 26, a waveform of synthesizer 28 generating the carrier signal having the center frequency of the noise is AM modulated by this amplified waveform, a noise waveform shown in FIG. 8(D) is reproduced and inputted to the electronic component, the noise characteristics of which are to be tested.

Detailed description will hereunder be given of the second embodiment of the present invention.

Figure 9:
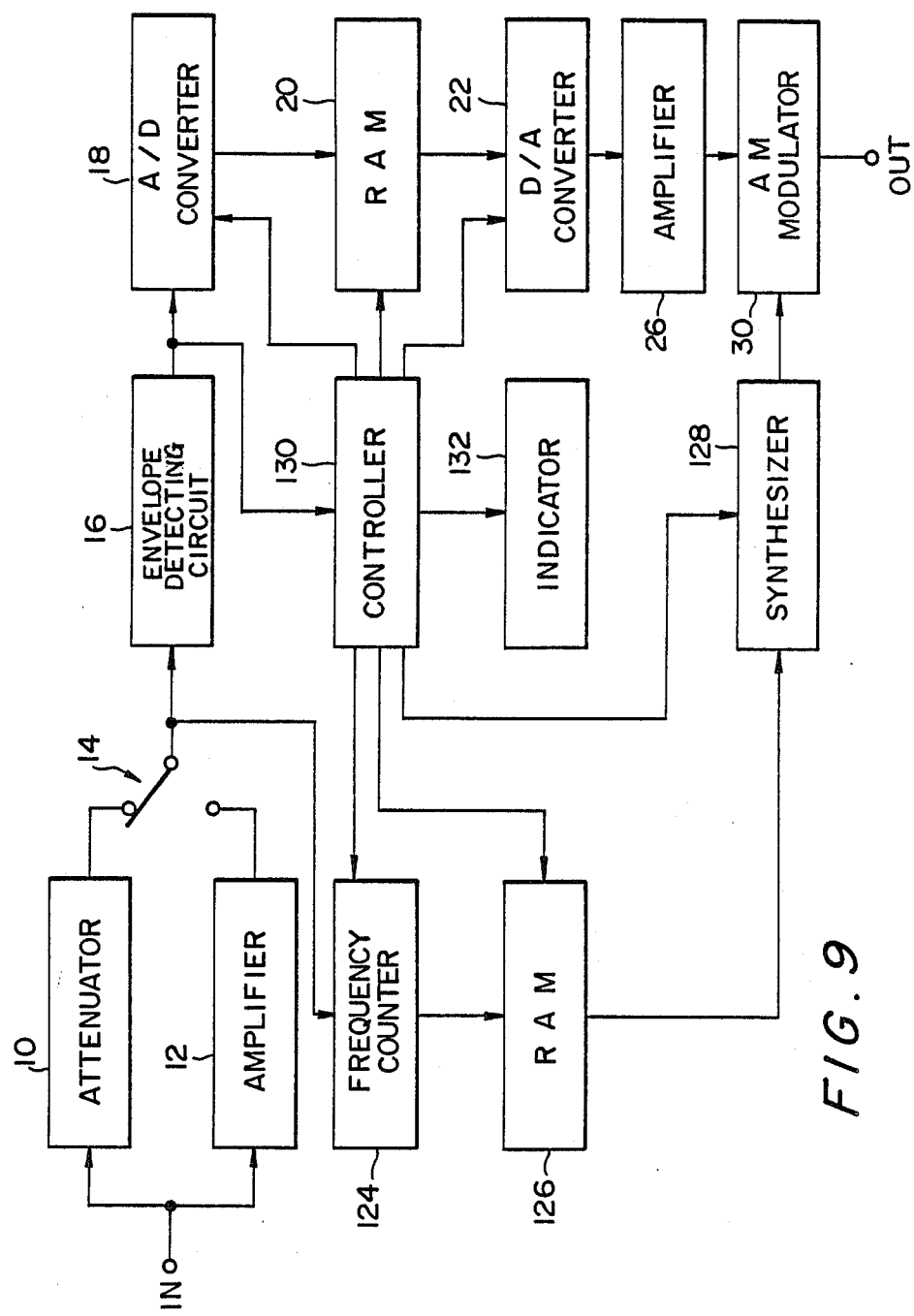
FIG. 9 is a block diagram showing the general arrangement of a second embodiment of the electric noise measuring and generating system according to the present invention.

As shown in FIG. 9, the second embodiment includes:

an attenuator 10, an amplifier 12, a change-over switch 14, an envelope-detecting circuit 16, an A/D converter 18, a RAM 20, a D/A converter 22, an amplifier 26 and an AM modulator 30, which are similar to those in the first embodiment;

a frequency counter 124 for counting repeated frequency of the electric noise level-regulated by the attenuator 10 or the amplifier 12 for a predetermined gate time T;

a RAM 126 for storing output from the frequency counter 124 as frequency data;

a synthesizer 128 for generating a carrier signal having the frequency data stored in the RAM 126 as its repeated frequency;

a controller 130 for starting the A/D converter 18 and the frequency counter 124 when the output level of the envelope-detecting circuit 16 reaches a preset value or more, causing the RAM's 20 and 126 to store the envelope waveform data and the frequency data until a preset period of time elapses, respectively, and for actuating the D/A converter 22 and the synthesizer 128 in response to a noise waveform reproduction command inputted from the outside; and an indicator 132 being controlled by the controller 130 to indicate the envelope waveform information and the frequency information.

The controller 130 has such functions as to cancel the counted value of the frequency counter 124 when the envelope waveform does not continue for the predetermined gate time T, and to indicate in the indicator 132 that the gate time T is excessively long.

Description will hereunder be given of action of the second embodiment.

Now, when the raw noise waveform is as shown in FIG. 10(A), this raw waveform is attenuated or amplified by the attenuator 10 or the amplifier 12, which is suitably selected by the change-over switch 14, envelope-detected by the envelope-detecting circuit 16, and comes to be an envelope-detected waveform as shown in FIG. 10(C). When this envelope waveform reaches a preset level or more, the controller 130 starts the A/D converter 18 and the frequency counter 124, makes access to the RAM's 20 and 126, and an A/D converter waveform as shown in FIG. 10(D) is stored in the RAM 20. The controller 130 repeatedly performs the above-described operation a certain number of times predetermined by the storage capacity of the RAM 20. By this, in the RAM 20, there are stored the envelope noise waveforms after the envelope reaches a certain level or more, until a preset period of time elapses.

On the other hand, the frequency counter 124 counts frequency of the noise raw waveform as shown in FIG. 10(A) for a predetermined gate time T, shown in FIG. 10(B) for example, and the result is stored in the RAM 126. Additionally, when the envelope waveform does not continue for the gate time T, the value measured by the frequency counter 124 is cancelled by the controller 130, and the information of that the gate time T is excessively long is indicated in the indicator 132.

On the other hand, in performing the reproduction of the noise waveform, the controller 130 makes access to the RAM's 20 and 126 in response to a noise waveform reproduction command inputted from the outside, and starts the D/A converter 22 and the synthesizer 128. By this, the envelope waveform thus reproduced is amplified by the amplifier 26, a carrier signal having the stored frequency data as its repeated frequency is AM modulated by this amplified waveform, the noise waveform shown in FIG. 10(E) is reproduced and inputted into an electronic component, the noise characteristics of which are to be tested.

In each of the above-described embodiments, the attenuator 10 and the amplifier 12 are provided on the input side of the envelope-detecting circuit 16, whereby when the attenuation factor of the attenuator 10 or the amplification factor or gain or mu-factor of the amplifier 12 is varied, so that the envelope waveform suitable for the dynamic range of the A/D converter 18 can be inputted to the A/D converter 18, thus enabling to perform the A/D conversion with high accuracy.

Furthermore, in each of the above-described embodiments, the controller 24 or 130 causes the RAM 20 to store the envelope waveform upon the output level from the envelope-detecting circuit 16 reaching a preset value or more, during a preset period of time, so that the envelope waveform can be accurately stored with a small storage capacity.

Further, in each of the above-described embodiments, the amplification factor or gain or mu-factor of the amplifier 26 is made variable, so that the noise waveform on an optional level can be reproduced in conformity with the purpose of test of the electronic component.

What is claimed is:

1. An electric noise measuring and reproducing system for measuring electric noise to be applied to an electronic component from a noise generating source and reproducing said electric noise, said system comprising:
    means for envelope-detecting said electric noise and producing an envelope-detected waveform;
    means for analog-todigital converting said envelope-detected waveform and for storing said analog-to-digital converter envelope-detected waveform;
    means for digital-to-analog converting the stored analog-to-digital value and for reproducing the envelope-detected waveform as an analog signal;
    means for generating a carrier signal having a center frequency of said electric noise; and
    means for amplitude-modulating said carrier signal by said analog signal and for producing a noise waveform.

2. An electronic noise measuring and reproducing system as set forth in claim 1, further comprising means for regulating an input level of the electric noise to be envelope-detected by said envelope-detecting means.

3. An electric noise measuring and reproducing system as set forth in claim 1, wherein said storing means stores said analog-to-digital converted envelope waveform upon said envelope waveform reaching a preset value at preset periods of time.

4. An electric noise measuring and reproducing system as set forth in claim 1, further comprising means for amplifying said analog signal wherein a gain of said amplifying means is variable.

5. An electric noise measuring and reproducing system for measuring electric noise to be applied to an electronic component and reproducing said electric noise, said system comprising:
    means for envelope-detecting said electric noise and producing an envelope-detected waveform;
    means for analog-to-digital converting said envelope-detected waveform,
    means for counting a repetition frequency of said electric noise;
    means for storing said analog-to-digital converted waveform and for storing said repetition frequency;
    means for digital-to-analog converting the stored analog-to-digital value and for reproducing the envelope-detected waveform as an analog signal;
    means for generating a carrier signal having said repetition frequency as its repeated frequency; and
    means for amplitude-modulating said carrier signal by said analog signal and for producing a noise waveform.

6. An electric noise measuring and reproducing system as set forth in claim 5, wherein said envelope waveform reproducing means optionally changes the envelope waveform to be reproduced.

* * * * *